United States Patent [19]

Knight et al.

[11] Patent Number: 5,440,251

[45] Date of Patent: Aug. 8, 1995

[54] PHASE DIFFERENTIAL MEASUREMENT CIRCUIT

[75] Inventors: Alex Knight, Danville, Ind.; Richard L. Walsworth, Westlake Village, Calif.

[73] Assignee: Harris Corporation, Melbourne, Fla.

[21] Appl. No.: 193,817

[22] Filed: Feb. 9, 1994

[51] Int. Cl.$^6$ ............................................. G01R 25/00
[52] U.S. Cl. .................................... 327/3; 327/7; 327/12
[58] Field of Search ............... 307/514, 516, 471, 479, 307/511; 328/133; 327/3, 7, 8, 12

[56] References Cited

U.S. PATENT DOCUMENTS 4,246,497  1/1981  Lawson et al. ................... 328/133
5,315,186  5/1994  Baker .................................. 327/3

Primary Examiner—Timothy P. Callahan
Assistant Examiner—Eunja Shin
Attorney, Agent, or Firm—Charles Wands

[57] ABSTRACT

A signal processing circuit measures the phase difference between digitally formated reference tone and telephone line signals over a prescribed number of signal periods so as to provide to an attendant processor an average value of phase differential. The reference tone and line signals are conditioned as square wave signals, and applied to a first exclusive-OR circuit and to respective divide-by-two flip-flop circuits, which produce square wave signals having a frequency which is half the frequency of the conditioned square wave signals. The output of the first exclusive-OR circuit represents the half-cycle phase difference between the two sine waves. The full-cycle square wave signals are applied to a second exclusive-OR circuit, which produces a series of pulses, each representing a respective full-cycle phase difference between the reference and line sine waves. The delayed outputs of the exclusive-OR circuits are selectively coupled to first and second counters, which provide a measure of average phase delay between the reference and line signals. The delayed pulse signal associated with a respective full-cycle difference between the reference and line sine waves is applied to the clock input of a lead/lag flip-flop, the data input of which receives the reference half-cycle square wave. The lead/lag flip-flop output indicates whether the phase of the reference tone leads or lags the phase of the line signal.

4 Claims, 2 Drawing Sheets

PHASE DIFFERENTIAL MEASUREMENT CIRCUIT

FIELD OF THE INVENTION

The present invention relates in general to telephone line measurement circuits, and is particularly directed to a circuit for measuring the phase difference between two sine waves or tone signals, such as a reference audio tone and a line response tone associated with the measurement of the capacitance of the telephone line.

BACKGROUND OF THE INVENTION

Telephone line measuring and test equipment is customarily equipped with the capability of asserting line conditioning stimuli and measurement tone signals onto the (tip and ring) portions of the line and observing the response of the line to the asserted conditions and signals in order to obtain a measurement of the signal conveying capability of the line. One of the measurements that is carried out is a capacitance measurement operation, in which a prescribed low frequency audio reference tone (e.g. 30 Hz) is asserted on the line and the phase delay of a response tone measured across the line, which is indicative of the capacitance of the line, is observed.

With the increasing use of microprocessor-based equipment of telephone signal processing applications, it is desirable to minimize the number of discrete (analog) components that have been conventionally employed for functions such as capacitance measurement, and to transfer the task to a digital environment, where extremely precise analysis may be conducted in accordance with a programmable signal processing mechanism.

SUMMARY OF THE INVENTION

In accordance with the present invention, this objective is accomplished by means of a new and improved phase differential measurement circuit, which converts capacitance measurement sine wave signals (the phase difference between which is to be measured) into digital format and to preprocess the digitally formatted signals into digital code values that may be readily analyzed by an attendant microprocessor which conducts a plurality of line analysis functions.

More particularly, the present invention is directed to a signal processing circuit which measures the phase difference between a reference tone signal and a telephone line response signal, the measurement being provided in digital format, representative of the phase differential over a prescribed number of signal periods so as to provide to an attendant processor an average value of phase differential.

For this purpose, the present invention comprises first and second conditioning circuits which format the reference tone signal and the line response signal into first and second square wave signals. These first and second square wave signals are applied to a first exclusive-OR circuit and to first and second divide-by-two flip-flop circuits, which produce third and fourth square wave signals having a frequency which is half the frequency of the first and second square wave signals. The output of the first exclusive-OR circuit is representative of the half-cycle phase difference between the two sine waves.

The third square wave signals are applied to a second exclusive-OR circuit, the output of which is a series of pulses, each of which is representative of a respective full-cycle phase difference between the reference and line sine waves. The full-cycle phase differential signal, although providing a coarser measurement of phase differential than a half-wave signal, has the advantage of being more stable and less sensitive to DC offset than are half-cycle measurements.

The output of each of the exclusive-OR circuits is coupled to a multiplexer, the output of which is coupled to a delay circuit. The multiplexer is controlled by an attendant microprocessor to select which of the exclusive-OR circuits is to be read. A similar delay circuit is coupled to the output of the second exclusive-OR circuit. The delay circuits provide a digital filtering function, so as to produce respective 'clean' pulse signals.

The pulse signal associated with a respective full-cycle difference between the reference and line sine waves is applied to the clock input of a lead/lag flip-flop. The data input of the lead/lag flip-flop is coupled to receive the first square wave signal. The output of the lead/lag flip-flop provides a logical level output signal representative of whether the phase of the first square wave signal leads or lags the phase of the second square wave signal by less than a prescribed phase delay (180°).

The delayed multiplexer output is coupled to first and second counters, which provide a measurement of the number of (half-cycle or full-cycle) phase differential representative pulses, and the total duration of the pulse count. The first counter counts the number of phase differential pulses, while the second counter has its count input coupled to receive a high speed clock signal and is enabled by the active-high phase differential pulse signals. As a consequence, the number of high speed clock signals counted by the second counter is representative of the total duration of the number of active-high phase differential pulses.

The count values registered in the counters are readable by the control processor to derive a measure of the average phase delay (the total duration represented by the count in the second counter divided by the count in the first counter), between the reference tone and the line tone.

DETAILED DESCRIPTION

As pointed out briefly above, the phase differential measurement circuit of the present invention measures the phase difference between two sine wave signals in the form of a reference tone signal and a telephone line response signal, with the measurement being conducted in digital format and being representative of the phase differential over a prescribed number of signal periods, so as to provide to an attendant processor an average value of phase differential.

Figure 1:
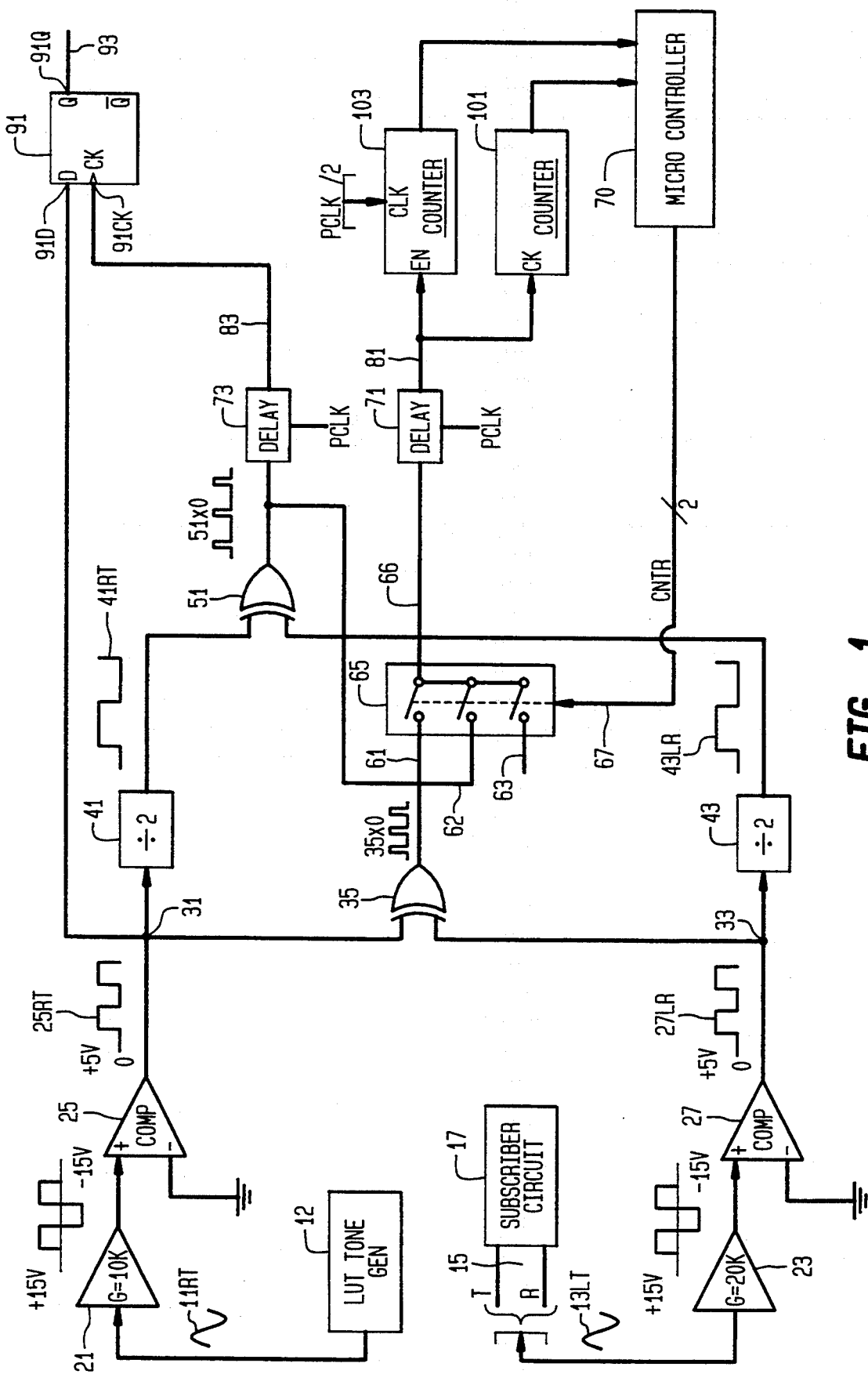
FIG. 1 is a circuit diagram of the differential phase measurement circuit of the present invention.
Figure 2:
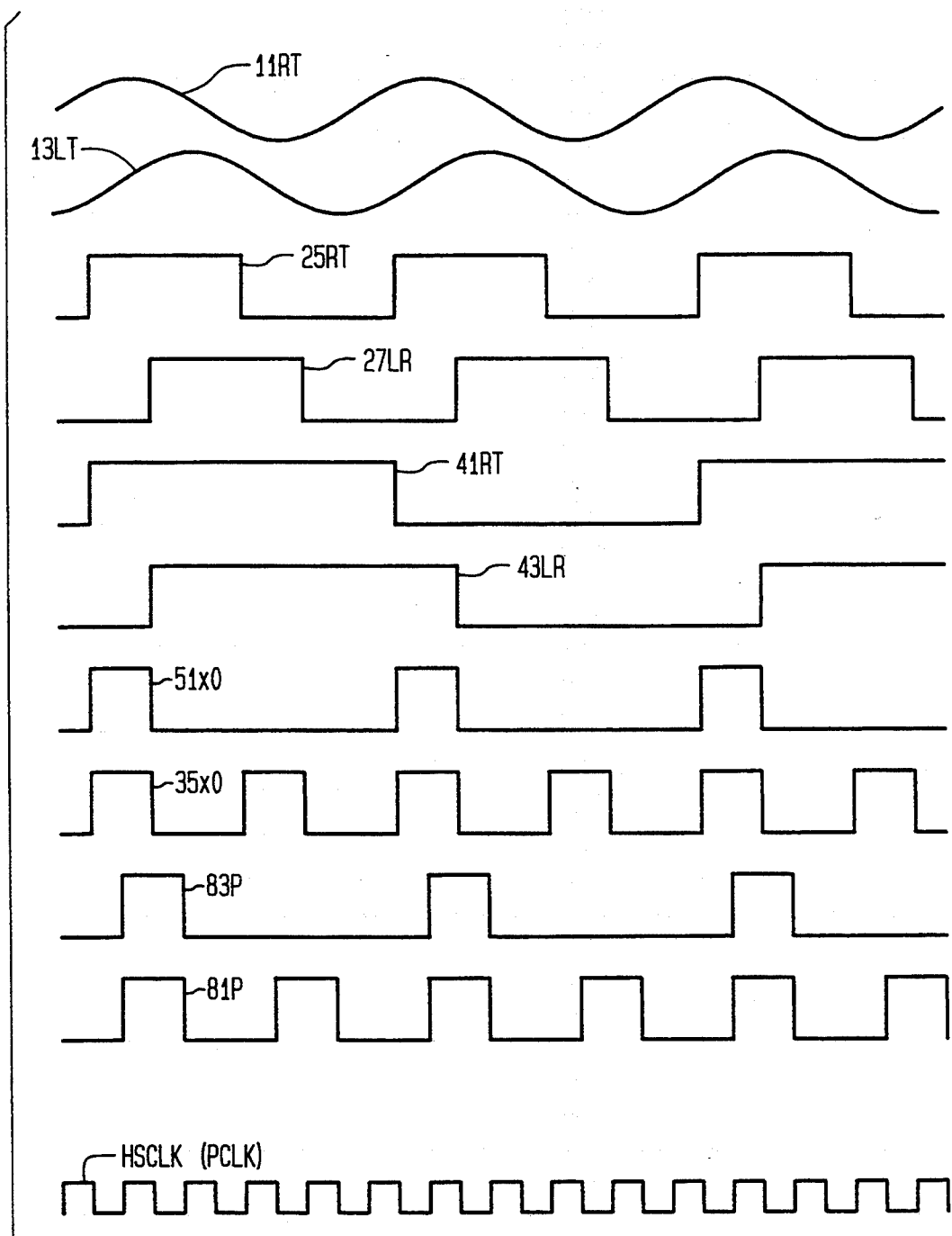
FIG. 2 is a timing diagram illustrating the operation of the differential phase measurement circuit of FIG. 1.

The differential phase measurement circuit of the present invention is diagrammatically illustrated in FIG. 1 as comprising first and second input terminals 11 and 13, to which are respectively applied a reference tone signal or sine wave (illustrated at 11RT in FIG. 1 and the timing diagram of FIG. 2 and supplied by a tone generator of a line test unit, diagrammatically shown at 12), and a line response tone signal (illustrated at 13LT in FIG. 1 and the timing diagram of FIG. 2), such as that measured across the tip and ring portions of a telephone line, shown diagrammatically at 15, and to which a subscriber line circuit 17 is coupled. A non-limiting example of a precision tone generator circuit that may be used to generate an audio tone signal (e.g., a 30 Hz tone) for conducting capacitance measurements on the line is that described in our co-pending patent application Ser. No. 08/193,812, entitled: Programmable Source for Supplying Controllably Variable AC/DC Voltage Output for Telephone Line Measurement Apparatus, by Alex Knight et al, filed coincident with the filing of the present application, assigned to the assignee of the present application and the disclosure of which is herein incorporated.

The reference tone 11RT and the line response signal 13LT are respectively coupled to first and second conditioning circuits, comprised of cascaded high gain amplifier stages 21 and 23 and comparator circuits 25 and 27, respectively, which format the reference tone sinewave signal 11RT and the line response signal 13LR into first and second square wave signals, shown at 25RT and 27LR, at nodes 31 and 33.

These first and second square wave signals 25RT and 27LR are applied to a first exclusive-OR circuit 35 and to first and second divide-by-two flip-flop circuits 41 and 43, respectively. The divide-by-two flip-flop circuits 41 and 43 produce third and fourth square wave signals 41RT and 43LR, respectively, having a frequency which is half the frequency of the first and second square wave signals. The output of the first exclusive-OR circuit, shown at 35XO comprises a pulse train the duration of each pulse being representative of a respective half-cycle phase difference between the two sine waves. This half-cycle phase differential signal, although having greater susceptibility to noise (e.g., 60 Hz hum) than a full-wave signal, has the advantage of providing twice the number of phase differential pulses in a given period of time of what a full-cycle signal can provide.

The third and fourth square wave signals 41RT and 43LR are applied to a second exclusive-OR circuit 51, the output of which, shown at 51XO, comprises a series of pulses, with each pulse being representative of a respective full-cycle difference between the reference and line sine waves. The full-cycle phase differential signal, although providing a coarser measurement of phase differential than a half-wave signal, has the advantage of being more stable and less sensitive to DC offset than are half-cycle measurements.

The output of each of exclusive-OR circuits 35 and 51 is coupled to first and second inputs 61, 62 of a multiplexer 65, the output 66 of which is coupled to a delay circuit 71. Multiplexer 65 is controlled by an attendant microprocessor 70 via control input link 67, to select which of exclusive-OR circuits 35 and 51 will have its output coupled to output 66.

A similar delay circuit 73 is coupled to the output of exclusive-OR circuit 51. These delay circuits are driven by a clock signal denoted PCLK and shown in FIG. 2 having a frequency considerably higher than the frequency of the sinewave of interest. The delay circuits provide a digital filtering or smoothing function, so as to produce respective 'clean' pulse signals 81P and 83P on lines 81 and 83, respectively.

The pulse signal 83P associated with a respective full-cycle difference between the reference and line sine waves is applied to the clock input 91CK of a lead/lag flip-flop 91. The data input 91D of lead/lag flip-flop 91 is coupled to receive the first square signal 25RT. The output 91Q of lead/lag flip-flop provides a logical level output signal on line 93 representative of whether the phase of the first square wave signal 25RT leads or lags the phase of the second square wave signal 27LR (high if leads, low if lags) by less than a prescribed phase delay (180°).

Line 81 is coupled to first and second counters 101 and 103, which provide a measurement of the number of (half-cycle or full-cycle) phase differential representative pulses provided by multiplexer 65, and the total duration of the pulse count. Specifically, the first counter 101 has its count input coupled to line 81, and when enabled by microprocessor control, counts the number of pulses on line 81. The second counter 103 has its count input coupled to receive the PCLK/2 signal and is enabled by the active-high pulse signals on line 81. As a consequence, the number of PCLK signals counted by counter 103 is representative of the total duration of the number of active-high pulses on line 81. The count values registered in counters 101 and 103 are readable by the control processor to derive a measure of the average phase delay (the total duration represented by the count in counter 103 divided by the count in counter 101), between the reference tone and the line tone. Whether the measured phase differential corresponds to a phase lead or phase lag is indicated by the logical level on line 93, as described above. For a phase lead (the phase of the reference tone leads the phase of the line tone), the logic level on line 93 is high; for a phase lag, the logic level on line 93 is low.

As will be appreciated from the foregoing description, the present invention provides a phase differential measurement circuit which converts (telephone line capacitance measurement) sine wave signals (the phase difference between which is to be measured) into digital formatted half-cycle and full-cycle signals, which are preprocessed into digital code values that may be readily analyzed by an attendant microprocessor to derive a measure of the magnitude of average phase differential over a prescribed signal duration and whether the phase differential is a lead or lag differential.

While we have shown and described a particular implementation of the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed:

1. A circuit for measuring the phase difference between first and second signals comprising:
   first and second conditioning circuits which format said first and second signals into first and second square wave signals;
   first and second divider circuits to which said first and second square wave signals are applied, and which produce third and fourth square wave signals having a frequency which is a fraction of the frequency of said first and second square wave signals;

a first exclusive-OR circuit having first and second inputs to which said third and fourth square wave signals are applied, and an output;

a delay circuit coupled to the output of said first exclusive-OR circuit and being operative to provide a delayed output of said first exclusive-OR circuit; and a lead/lag flip-flop having a data input coupled to receive said first square wave signal, a clock input coupled to the delayed output of said first exclusive-OR circuit, and an output which provides a logical level output signal representative of whether the phase of said first square wave signal leads or lags the phase of said second square wave signal by less than a prescribed phase delay.

2. A circuit according to claim 1, further including a second exclusive-OR circuit having first and second inputs to which said first and second square wave signals are applied, and an output, a digital counter circuit to which a prescribed clock signal is applied, a multiplexer to which outputs of said first and second exclusive-OR circuits are coupled, said digital counter having a control input that is selectively coupled via said multiplexer to the output of one of said first and second exclusive-OR circuits.

3. A circuit according to claim 1, wherein said prescribed phase delay is 180 degrees.

4. A circuit according to claim 1, wherein said first and second divider circuits produce third and fourth square wave signals having a frequency which is one-half the frequency of said first and second square wave signals.

* * * * *